(12) United States Patent
Sandlin et al.

(10) Patent No.: US 6,797,137 B2
(45) Date of Patent: Sep. 28, 2004

(54) MECHANICALLY ALLOYED PRECIOUS METAL MAGNETIC SPUTTERING TARGETS FABRICATED USING RAPIDLY SOLIDFIED ALLOY POWDERS AND ELEMENTAL PT METAL

(75) Inventors: Michael Sandlin, Gilbert, AZ (US); Bernd Kunkel, Phoenix, AZ (US); Willy Zhang, Chandler, AZ (US); Phillip Corno, Tempe, AZ (US)

(73) Assignee: Heraeus, Inc., Chandler, AZ (US)

( * ) Notice: Subject to any disclaimer, the term of this patent is extended or adjusted under 35 U.S.C. 154(b) by 181 days.

(21) Appl. No.: 09/832,181

(22) Filed: Apr. 11, 2001

(65) Prior Publication Data

US 2002/0170821 A1 Nov. 21, 2002

(51) Int. Cl.[7] ............................. C23C 14/34; H01F 1/18
(52) U.S. Cl. ............................. 204/298.13; 204/298.12; 148/313; 148/425; 420/435; 420/476
(58) Field of Search ....................... 204/298.13, 298.12, 204/192.2, 292.2; 420/435, 476; 148/313, 425

(56) References Cited

U.S. PATENT DOCUMENTS

| 4,135,286 A | 1/1979 | Wright et al. ................... 419/8 |
| 4,331,476 A | 5/1982 | Helderman et al. ........... 419/38 |

(List continued on next page.)

FOREIGN PATENT DOCUMENTS

| EP | 04297572 | 10/1992 |
| EP | 05148631 | 6/1993 |
| JP | 8-260136 | * 10/1996 |
| JP | 10-088333 | * 4/1998 |
| JP | 2000-282229 | 10/2000 |
| WO | WO 02/083974 | 10/2002 |

OTHER PUBLICATIONS

Machine Translation of 8–260136.*

"Effect of target processing on CoCrPtTa thin–film media", S.D. Harkness IV et al., *Journal of Materials Research*, vol. 15, No. 12, Dec. 2000, pp. 2811–2813, ISSN: 0884–2914.

"Cobalt alloys and the search for 10–Gbit/in2 recording media", XIONG et al, *Data Storage*, vol. 3, No. 6, Jul. 1996, p. 47, found at http://ds.pennnet.com/Articles/Article_Display.cfm?Section=Archives&Subsection=Display&ARTICLE_ID=37020.

*Primary Examiner*—Rodney G. McDonald
(74) *Attorney, Agent, or Firm*—McDermott Will & Emery LLP (57) ABSTRACT

A cobalt-chromium-boron-platinum sputtering target alloy having multiple phases. The alloy can include Cr, B, Ta, Nb, C, Mo, Ti, V, W, Zr, Zn, Cu, Hf, O, Si or N. The alloy is prepared by mixing Pt powder with a cobalt-chromium-boron master alloy, ball milling the powders and HIP'ing to densify the powder into the alloy.

11 Claims, 9 Drawing Sheets

U.S. PATENT DOCUMENTS

| | | | |
|---|---|---|---|
| 4,731,116 A | 3/1988 | Kny | 75/238 |
| 4,770,948 A | 9/1988 | Oikawa et al. | 428/664 |
| 4,820,393 A | 4/1989 | Brat et al. | 204/192.15 |
| 4,938,798 A | 7/1990 | Chiba et al. | 75/230 |
| 4,943,362 A | 7/1990 | Schlamp et al. | 204/298.13 |
| 5,160,534 A | 11/1992 | Hiraki | 75/248 |
| 5,234,487 A | 8/1993 | Wickersham, Jr. et al. | 75/248 |
| 5,306,569 A | 4/1994 | Hiraki | 428/569 |
| 5,342,571 A | 8/1994 | Dittmar et al. | 419/13 |
| 5,415,829 A | 5/1995 | Ohhashi et al. | 419/23 |
| 5,435,965 A | 7/1995 | Mashima et al. | 419/8 |
| 5,464,520 A | 11/1995 | Kano et al. | 204/298.13 |
| 5,468,305 A * | 11/1995 | Uchida et al. | 148/120 |
| 5,470,527 A | 11/1995 | Yamanobe et al. | 419/53 |
| 5,561,833 A | 10/1996 | Tomioka et al. | 419/19 |
| 5,618,397 A | 4/1997 | Kano et al. | 204/298.13 |
| 5,718,778 A | 2/1998 | Murata et al. | 148/668 |
| 5,778,302 A | 7/1998 | Ivanow | 204/298.13 |
| 6,042,777 A | 3/2000 | Lo et al. | |
| 6,159,625 A | 12/2000 | Ueno | |
| 6,372,104 B1 * | 4/2002 | Schlott et al. | 204/298.13 |
| 6,406,600 B1 | 6/2002 | Takashima | 419/32 |
| 6,514,358 B1 * | 2/2003 | Bartholomeusz et al. | 148/300 |
| 2002/0014406 A1 | 2/2002 | Takashima | |

* cited by examiner

MECHANICALLY ALLOYED PRECIOUS METAL MAGNETIC SPUTTERING TARGETS FABRICATED USING RAPIDLY SOLIDFIED ALLOY POWDERS AND ELEMENTAL PT METAL

The invention relates to precious metal magnetic sputtering targets and the method of making the same. According to the invention, solid alloy powders manufactured via rapid solidification and elemental Pt are mechanically alloyed, densified, and machined into a sputtering target.

THE INVENTION

The objective of this invention is to achieve enhanced sputtering target characteristics from manufacturing and applications standpoints, through the utilization of innovative processing that enables novel microstructural design. The innovative process design has been developed with careful consideration of cost, lead time, and final product properties. The microstructural design has been developed with the intent to increase manufacturability and enhance product performance in application. In this invention, targets are manufactured using conventional processing steps such as gas atomization, powder mixing and milling, hot isostatic pressing, and machining, and, although the process steps themselves are not unique, the process steps have been strategically employed to achieve a superior sputtering target while maintaining competitive costs and lead-times in manufacturing. The novel microstructure created using the process described in this invention is characterized by a fine precipitate structure and a high degree of compositional homogeneity.

Gas atomization is a common method used to produce powdered metals for a broad range of industrial applications. It is generally recognized that this technique produces fine spherical powders with microstructures unique to rapidly solidified materials. Although atomization has been used in the sputtering target industry to make a range of alloy powders, atomization has not been used with the intent of reducing precipitate phase size in multiphase cobalt-based magnetic alloys. In this invention, gas atomization is used to produce alloy powders with fine microstructures, which lead to enhanced manufacturability during the mechanical working stage of the densified powders, and superior target microstructural and compositional homogeneity when compared to conventionally cast processing techniques. In general, the ductility of a multiphase metallic material is principally determined by the ductility of the continuous phase or phases in its microstructure. In a multiphase microstructure, the degree of continuity of a given phase is a function of its size and shape. For example, coarse microstructural features with high aspect ratios will become interconnected at much lower volume fractions than phases that are fine and spherical. This geometric fact can be summed up by stating that the percolation volume fraction limit of a given phase is inversely proportional to phase size and directly proportional to aspect ratio.

An example of this phenomenon occurs in CoCrPtB alloys containing greater than 6 atomic % B. When these materials are manufactured via conventional casting, they contain a brittle phase that is coarse and elongated. Because of its size and morphology, this phase is interconnected throughout the microstructure, and therefore dominates the mechanical behavior of the material and renders it brittle. In contrast, the same alloys, when manufactured in accordance with the invention tend to be much more ductile. This occurs because the brittle phases that are present in the microstructure are fine and equiaxed, and are therefore not continuous.

The microstructural differences that arise between the conventionally processed material, and the material processed using gas atomization are a result of the difference in the solidification rates of the two processes. Rapidly solidified materials tend to have much finer microstructures than conventionally cast materials. The intent of this invention is to strategically apply this phenomenon to the manufacture of cobalt-based sputtering targets, to promote superior mechanical working characteristics. The increases in ductility that are realized using the process steps outlined in the invention lead to high process yields during thermomechanical processing, which translate into manufacturing cost savings.

In addition, because the volume fraction of brittle phase in CoCrPtB alloys is a strong function of boron content, the relative increase in ductility, and therefore, the enhanced mechanical processing characteristics, for materials made in accordance with the invention becomes more pronounced as boron content increases. This amplifies the benefits of the invention as the requirements for increased boron content become more important in the media industry. Furthermore, in cases where the boron content of the finished target is above 10 at %, the invention becomes an enabling technology because conventional casting and mechanical working techniques become completely ineffective at these levels of boron.

Requirements for compositional homogeneity on thin film media have increased drastically over the last several years due to advances in head technology and disk storage capacity. This requirement has generated an industry need for multiphase sputtering targets with increased microstructural homogeneity, because increased target microstructure homogeneity reduces compositional gradients in sputtered films. In a paper by Harkness et al., *J. Mater. Res.*, Vol. 15, No. 12, December 2000, p. 2811), this result is clearly demonstrated in the case of CoCrPtTa alloys. Although the alloy system investigated in this reference did not contain boron, and although the target microstructural manipulation processes did not involve the rapid solidification techniques discussed herein, the general results are salient to supporting the art described herein. The current invention employs two primary methods for attaining excellent compositional homogeneity within sputtering targets with complex chemistries. The first method is rapid solidification of the base master alloy powders used to make the targets. Rapid solidification leads to chemically homogeneous fine powders containing fine precipitates. The small scale of the particles and precipitates promote excellent point-to-point chemical uniformity within powder mixtures and, in turn, within finished targets. The second method is the mechanical alloying of the base powders using ball milling, or some other mechanical alloying technique. Mechanical alloying leads to alloy powder mixtures with extremely low chemical variability, and is therefore considered to be the optimum method for mixing powders of varying composition to create chemically homogeneous powder mixtures. The combination of these methods enables the fabrication of sputtering targets with greater chemical and microstructural uniformity when compared to targets made using conventional casting technology.

To demonstrate the degree of increased point-to-point homogeneity in sputtering targets manufactured via the invention relative to those made using conventional casting techniques, two targets were compared. Target 1 was made according to the invention and Target 2 was made using conventional techniques. Eight material samples were extracted from the targets in random locations using a standard drilling technique. Each sample was chemically analyzed for Co, Cr, Pt, B and Ta. The results indicates that the point-to-point chemical variability of Target 1 was significantly less than that of Target 2. The averages and standard deviations for the constituents measured in each of the samples is shown in the Table set forth below.

TABLE

Comparison of Point-To-Point Compositional Uniformity

|  | Co | Cr | Pt | B | Ta |
|---|---|---|---|---|---|
| Target 1 (Process X) Average (at %) | 63.922 | 21.530 | 8.054 | 4.557 | 1.937 |
| Target 1 (Process X) Std. Dev. (at %) | 0.067 | 0.040 | 0.035 | 0.034 | 0.004 |
| Target 2 (Cast) Average (at %) | 64.423 | 21.780 | 8.078 | 3.708 | 2.011 |
| Target 2 (Cast) Std. Dev. (at %) | 0.130 | 0.106 | 0.035 | 0.047 | 0.016 |

The standard processing paradigm in the sputtering target industry is to melt and cast alloys with the finished product composition. Platinum-containing alloys produced for sputtering target applications can be manufactured in a cost-competitive manner using standard alloying and casting practices. However, after examining the cost of manufacturing sputtering targets from Pt-containing atomized powders, it has become apparent that costs related to platinum losses during the atomization process render the process too costly to be a competitive sputtering target manufacturing process. Applicants have discovered a less costly method of manufacturing precious metal cobalt alloys by mechanically alloying elemental Pt powder with non-precious metal cobalt-based master alloy powders to reach the desired chemical composition, as opposed to atomizing a composition that contains Pt. Using this method, the Pt metal can be managed more efficiently during the entire target fabrication process, which substantially reduces the cost of manufacturing. This is a subtle, but critical, processing strategy employed in the invention to render it unique. To illustrate the potential for fabricated product cost savings, consider the following. A typical CoCrPtB alloy used in the data storage contains approximately 30% by weight Pt content. Gas atomization of the alloy, including Pt, results in a typical precious metal material yield loss of approximately 8%. In contrast, blending of Pt powder with gas atomized non-precious metal cobalt-based master alloy powders results in a typical precious metal yield loss of less than 2%. Pt currently costs over $20/gm (compared to Co at approximately $0.04/gm). Therefore, it is plain to see the tremendous cost benefit a 6% process improvement in Pt material yield provides. For example, this improvement in Pt yield loss translates to between a 20% to 30% fabrication cost reduction in CoCrPtB target products containing 12 atomic % Pt (approximately 30% by weight) and possessing a cylindrical geometry of approximate dimensions 7" diameter by 0.300" thick.

In addition to optimized cost structures, optimized process cycle time can offer a significant competitive advantage in the sputtering target industry. In the invention, significant cycle time reductions are achieved through using a set of master alloy powders with standardized compositions. These powders can be blended in various ratios to produce a wide range of final alloy compositions, thus avoiding the need to atomize a new batch of powder upon every newly requested alloy composition. The standard master alloy powders can be held in stock and the atomization cycle time can be eliminated from the process. Without this type of standardized material stocking method, it would be very difficult to have competitive cycle times on new material requests. In fact, the stocking of standard master alloy powders has been shown to reduce lead-times by as much as 80%.

An important quality metric that users of data storage targets consider when making purchasing decisions is lot-to-lot chemical consistency. The standard processing technique used to manufacture targets is a batch processes that comprises melting, casting and rolling steps. Typically, lot sizes weigh between 20 and 120 kg. A lot for which chemical composition is certified is defined as the product of the melting portion of the process. Lot-to-lot compositional variance due to natural process variations in standard melted CoCrPtB alloys are typically 0.5 atomic percent for each compositional species. Impurity levels also vary from lot-to-lot. In principle, to minimize chemical variation for a given alloy during the life of a media-manufacturing program, very large lots could be used, thus reducing the total number of lots necessary to manufacture the targets needed for the program. For example, if one very large lot were used, the lot-to-lot variation would be zero. However, maximum lot sizes for melt-processed materials are limited. Melting equipment with capacities greater than 150 kg are generally not economically feasible for manufacturing sputtering targets.

In the process of the invention, the blending portion of the process defines a lot for which chemical composition is certified. If, for example, ball milling is used for the blending portion of the process, it would be possible to economically produce large lots of material in one run. Ball mills with capacities in the 1000 kg range are not expensive relative to competitive manufacturing market metrics. The process of the invention allows the economic production of very large chemically homogeneous lots of material. This is a notable competitive advantage in the sputtering target industry.

SUMMARY OF THE INVENTION

The object of this invention is to provide for a multi-component, multiphase precious metal magnetic sputtering target typically comprising, but not limited to Co, Cr, Pt and B. To accomplish the object described above according to the present invention, there is provided a method for preparing the target, which comprises mechanically alloying a mixture of rapidly solidified cobalt master alloy powders with elemental platinum powder, and other elemental, ceramic, or alloy powders as required by the desired final composition. These and other objects and characteristics of the present invention will become apparent from the further disclosure of the invention that is given hereinafter with reference to the accompanying figures.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings.

FIG. 1 is an SEM image in of atomized Co-23Cr-2Ta-6B powder. This powder primarily comprises two phases. The lighter phase contains Co, Cr and Ta. The precipitated phase is the darker phase and principally contains Co and B. The atomization process yields a rapidly solidified microstructure that cannot be obtained using conventional casting techniques.

FIG. 2 is an SEM image of a hot isostatically pressed (hereinafter HIP'ed) master alloy Co-21Cr-8Pt-2Ta-5B alloy. The alloy was manufactured by ball milling (mechanically alloying) the powder in FIG. 1 with pure Pt powder and then Hipping the blended material. The light phase is principally pure Pt metal, and the dark phase is principally the remnant cobalt-based atomized powder.

DETAILED DESCRIPTION OF THE INVENTION

This invention relates to a sputtering target alloy and method of making the same. The target has the following characteristics.

Figure 1:
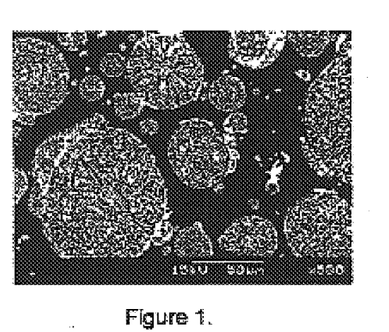
Figure 2:
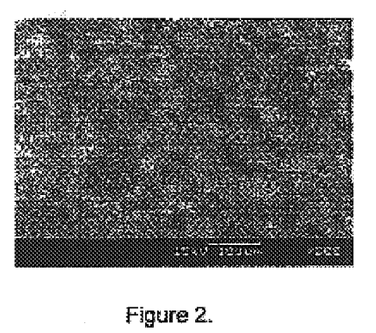
Figure 3:
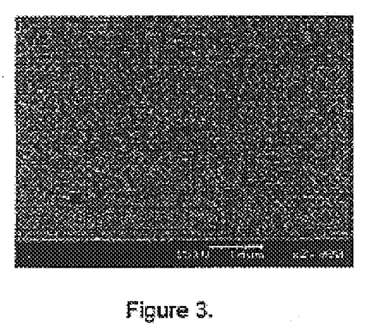
FIG. 3 is a higher magnification SEM image of the material depicted in FIG. 2. The higher magnification reveals a microstructure containing fine precipitates of multiple phases.
Figure 4:
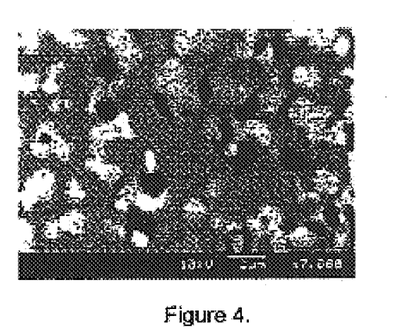
FIG. 4 is a higher magnification image of the material depicted in FIGS. 2 and 3. This image shows the presence of at least 4 phases. The scale of the precipitated phases is nominally less than 5 microns.
Figure 5:
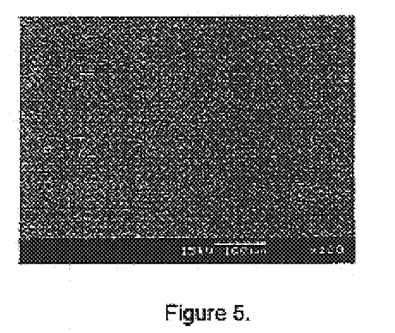
FIG. 5 compares a conventionally cast alloy of the same nominal composition.
Figure 6:
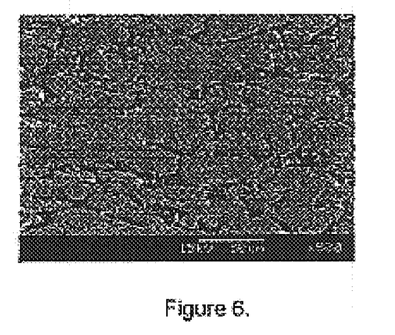
FIG. 6 is a higher magnification image of the conventionally cast material shown in FIG. 5.
Figure 7A:
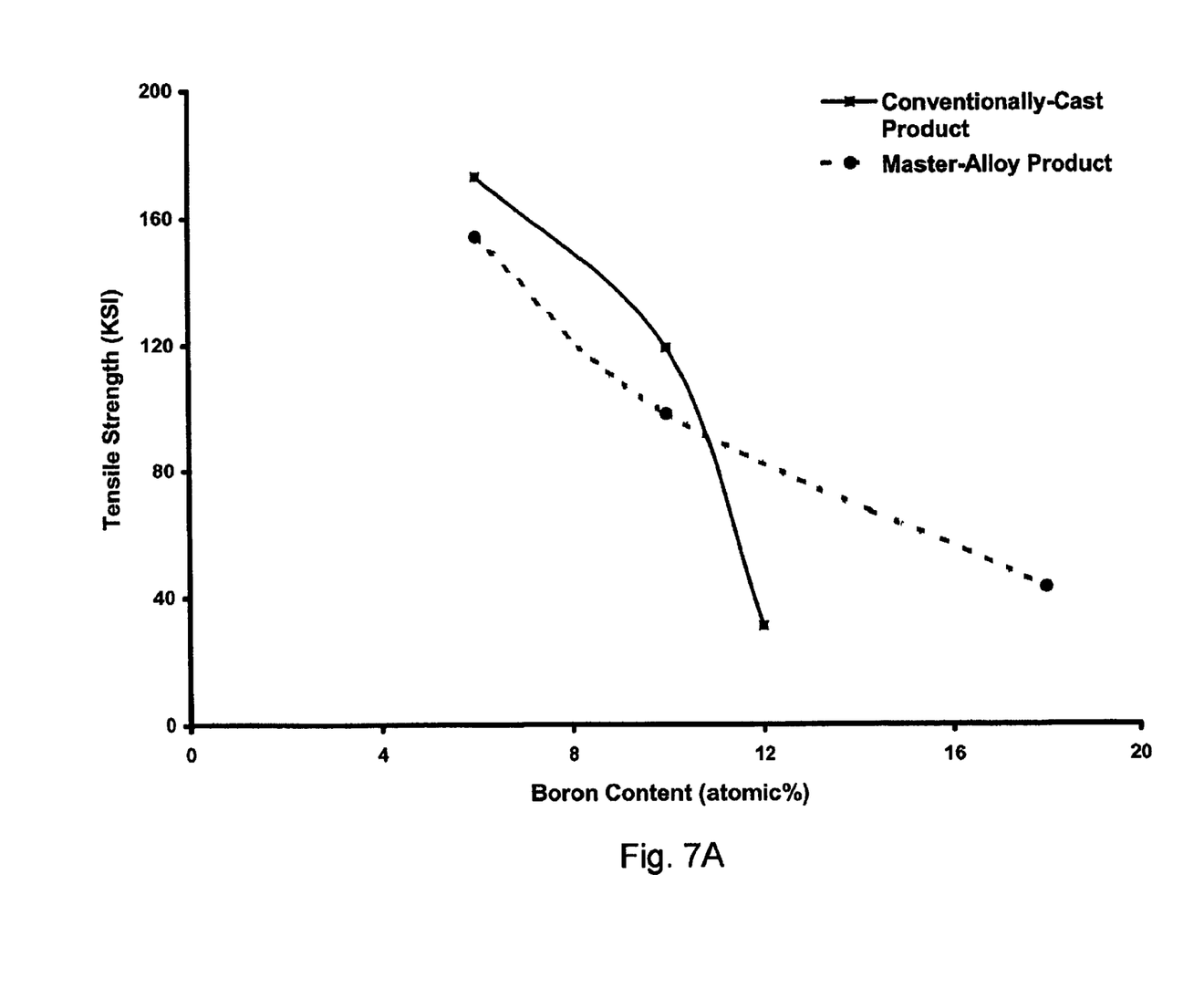
FIGS. 7A, 7B and 7C compare the tensile strength, tensile elongation and fracture energy of master alloyed and conventionally cast alloys based on boron content of the alloy.
Figure 7B:
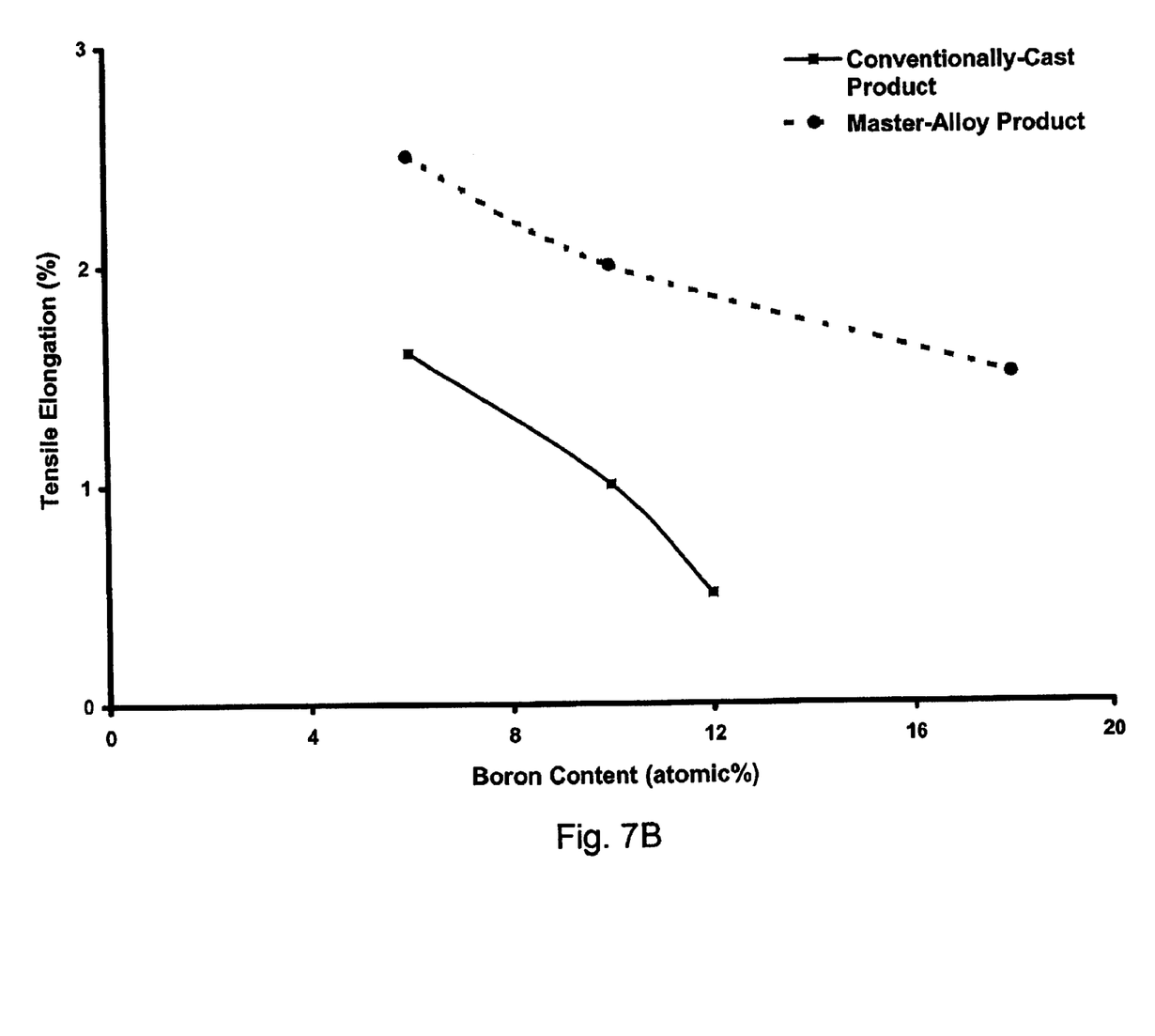
Figure 7C:
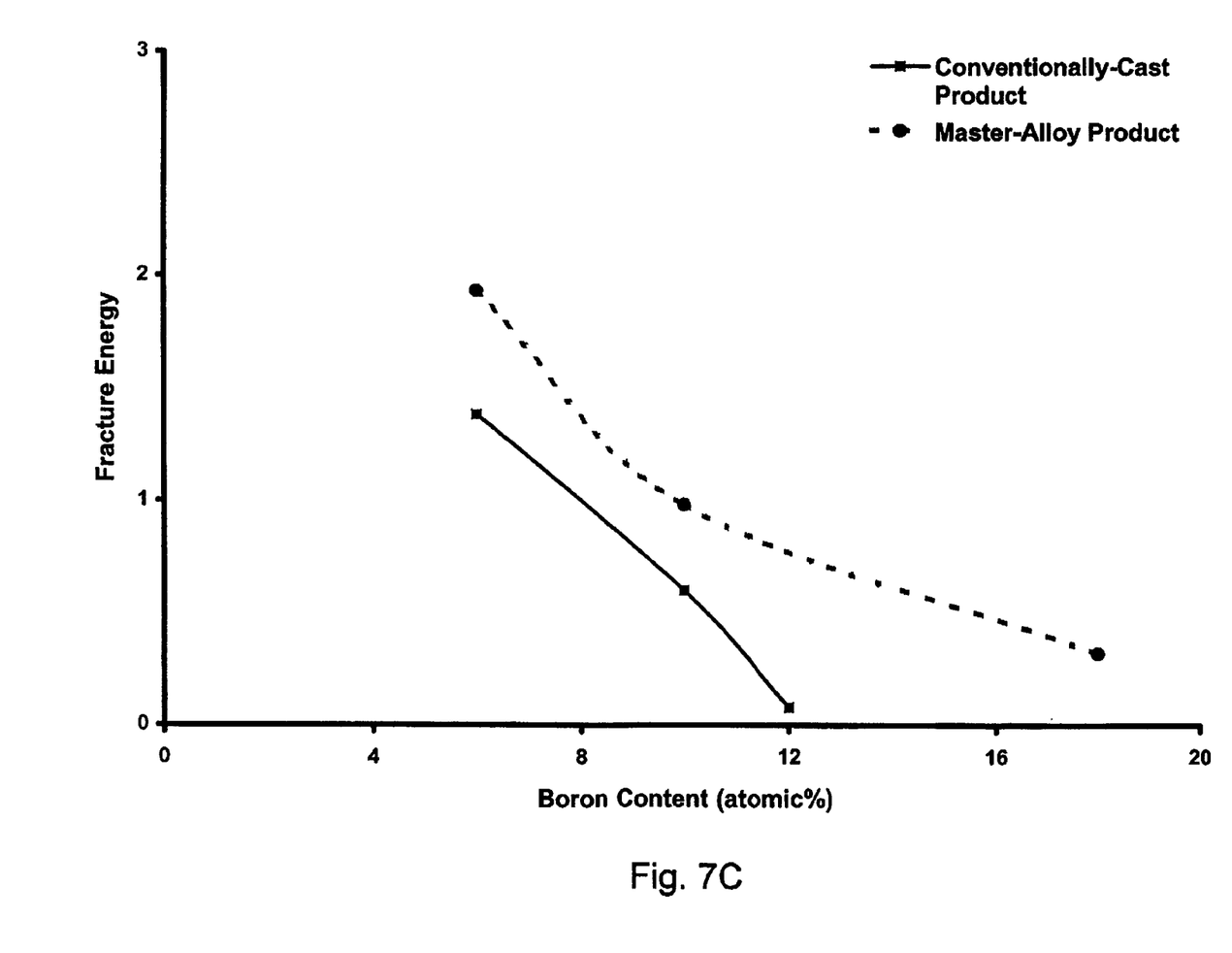

Microstructural characteristics: The rapidly solidified target alloy has multiple phases, typically CoB, CoCrB, CoCr, CoPt, CoCrPt and Pt. It also has a highly refined precipitate structure, typically ten times smaller than conventionally cast precipitate structures of similar composition. The differences in microstructure are illustrated by the comparison of FIGS. 1–4 with FIGS. 5 and 6. Clearly, the phases are also more uniformly distributed. These microstructural characteristics give rise to increased ductility and greater point-to-point compositional uniformity when compared to conventionally cast materials. See the Table. Increased ductility leads to improved process yields during thermomechanical processing, which contributes to reduced processing costs. Typical manufacturing yields employing conventional casting fabricated CoCrPt-8B target products range between 60% to 80%. Employing the art described herein for CoCrPt-8B target products, manufacturing yields better than 90% have been achieved. FIG. 7 depicts the significant improvement in tensile yield strength, tensile elongation, fracture strength and ductility of alloys manufactured using the art described herein. Ductility is defined as the area under the stress-strain curve, and is proportional to the energy required to fracture the material sample. Increased ductility also enables the fabrication of some target compositions, which could not be produced without the employment of the invention. Greater point-to-point compositional and microstructural uniformity within the targets will lead to improved disk-to-disk and single disk thin film property uniformity in sputtered films. Typically, during the physical vapor deposition process (also referred to as sputtering), a portion of the target atoms do not eject onto the thin-film device being fabricated, but rather deposit on the shield and chamber walls of the sputtering machine. Control of target chemical and microstructural homogeneity ensures that a larger fraction of sputtered atoms from the target physically deposit on the thin film disk instead of on the shield and chamber walls of the sputtering machine. Thus, the improvement in thin film properties arises from the more efficient transfer of atoms from target to thin film, due to the optimized chemical and microstructural homogeneity of the target material. This result is supported by a study on CoCrPtTa alloys by Harkness et al. and will be further substantiated in the example contained in this patent. Furthermore, the specific impact of small variations in chemistry on data storage thin film media properties are presented in a paper by Xiong et al., *Data Storage*, Vol. 3, No. 6, July 1996, p. 47.

Chemical characteristics: The target alloy is cobalt-based and contains platinum. The typical major constituents other than cobalt and platinum include one or more of the following: Cr, B, Ta, Nb, C, Mo, Ti, V, W, Zr, Zn, Cu, Hf, O, Si or N. When the target contains one or more of these elements, the typical concentration is between 0.2 atomic % and 30 atomic % depending on the atomic species. In general, Cr, B and Ta occur frequently in target compositions. Elements such as oxygen and nitrogen are usually added in the form of ceramic powders such as zirconium oxide or silicon nitride. The Pt content of the target typically ranges from 0 to 50 atomic %. Examples of target compositions described herein include Co-20Cr-10 Pt-2 Ta-5 B, Co-19 Cr-11 Pt-8 B, Co-15 Cr-11Pt-10B and Co-20Cr-10Pt-6B. Furthermore, other alloys that were made using the art described herein, but could not be fabricated using conventional techniques for comparative performance studies (due to their excessively brittle nature) were: Co-10Cr-10Pt-20B, Co-12Cr-12Pt-18B and Co-12Cr-8Pt-22B.

Figure 8:
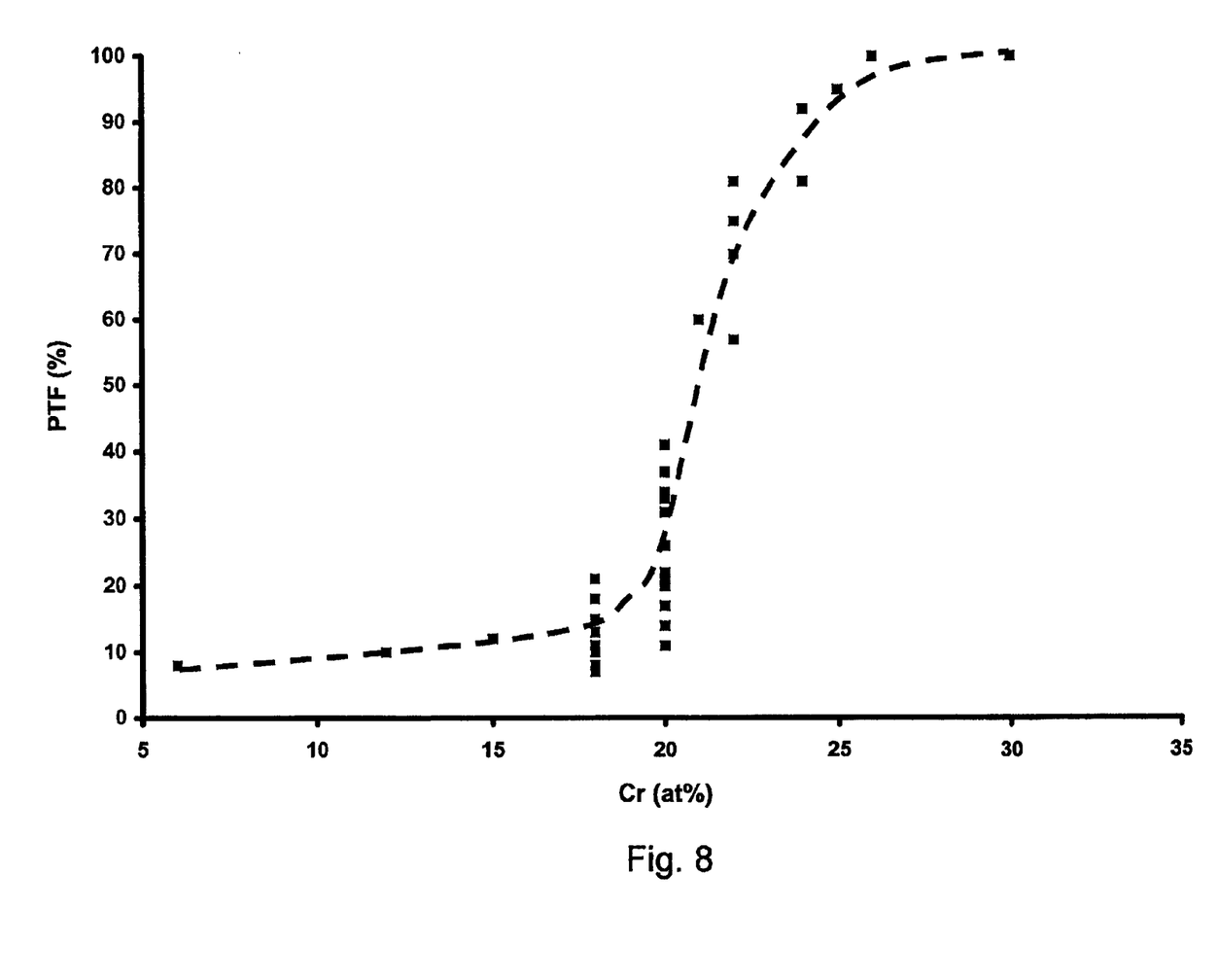
FIG. 8 depicts the dependence of intrinsic CoCrPtB alloy PTF on Cr content in atomic %.

Macroscopic physical properties: The target alloy exhibits increased ductility relative to conventionally cast alloys of similar chemical composition. The increase in ductility can be attributed to the reduction in size of brittle phases in the rapidly solidified and HIP'ed microstructure relative to the conventional cast microstructure. The reduction in phase size allows the more ductile majority phase to maintain continuity throughout the microstructure. In magnetron sputtering, matching the target material permeability (alternatively referred to as PTF=Pass-Through-Flux) to the cathode is important in the development of a stable electron plasma necessary for optimized atomic sputtering. Manipulation of the master alloy compositions to achieve a predetermined net nominal alloy composition renders significant flexibility in target material PTF design. Certain magnetron cathodes yield optimized sputter characteristics for target material PTF between 70% to 90%, while others achieve optimized sputter characteristics for target material PTF between 55% to 65%. FIG. 8 depicts the intrinsic dependence of PTF on CoCrPtB alloy Cr content. Using this and similar property maps, master alloy selection can be tailored to yield target materials with specifically designed macromagnetic properties. A specific feature of the art described herein is target product PTF manipulation between 25% to 100%.

Performance in Sputtering Applications: The target exhibits superior performance in hard disk media sputtering applications in comparison to targets manufactured via conventional casting as measured by single disk and disk-to-disk magnetic property uniformity. The improvement in disk properties is directly attributable to increased point-to-point chemical uniformity, reduced precipitate size and specific phase morphology within sputtering targets manufactured according to the invention. In addition to magnetic uniformity, single disk and disk-to-disk parametric property improvements have also been demonstrated. The inventors believe that improvements in parametric disk properties are due to the phase design of the sputtering targets. In the invention, sputtering target phases are designed to yield efficient transfer, during sputtering, of atoms from the target to the thin film disk. The optimum phase design was unexpectedly discovered during empirical trials. It appears that the specific combination of master alloy phases and pure Pt, described in Examples 1 and 2, conspire to promote a lower angle of atomic incidence during sputtering, yielding an improvement in efficiency of physical atoms transferred from the target to the thin film disk. This improvement in atom transfer efficiency has been shown to yield a concomitant improvement in hard disk magnetic and parametric performance, compared to disks manufactured using conventionally fabricated target product possessing equivalent nominal chemistry.

The method of manufacture of the target alloy generally includes the following sequence of steps. A set of cobalt-based master alloys are produced. The master alloys are produced using conventional atomization or some other rapid solidification technique. Typical master alloys include materials containing combinations of cobalt with some or all of the following elements: Cr, B, Ta, Ti, Nb, W and Mo. The master alloys are powders typically comprising 5–50 wt. % cobalt, 10–50 wt. % chromium with the remainder being either tantalum, titanium niobium, tungsten, molybdenum, boron or some combination of these elements. The master alloys are mixed in a specific ratio that is calculated to produce a final powder composition corresponding with the desired final target composition. This mixture typically contains some combination of masteralloy powders and elemental powders. For four-element CoCrPtB alloys, a preferred composition range for the master alloys is Co-(2 to 10 wt %)B, Co-(15 to 35 wt %)Cr-(2 to 10 wt %)B, Co-(15 to 25 wt %)Cr, and Co-(0 to 40 wt %)Cr-(0 to 12 wt %)B. The mixture is then mechanically alloyed with platinum, typically by ball milling the designed powder mixture with platinum powder. The resultant target alloy undergoes densification using a conventional HIP (hot isostatic pressing) process at a pressure ranging from 15,000 psi to 30,000 psi and temperatures between 1500° to 1900° F. for 1–6 hours. Conventional uniaxial die hot-pressing, or roll compaction can also be employed for densification. When Cr is included in the cobalt-based master alloy, the densification parameters are such as to promote or limit interdiffusion of Cr for the purpose of manipulating magnetic pass through flux in the resulting target alloy. Once the material is densified, targets are manufactured using conventional sputtering target fabrication practices.

The following examples illustrate a specific embodiment of the invention, but it is not to be considered as limiting the invention in any manner.

EXAMPLE 1

Co-(25 to 30)Cr-(15 to 20)B, Co-(25 to 30)Cr, and Co-(10 to 15)B (in weight %) master alloy powders were combined and mixed with a sufficient amount of platinum and Ta powder to produce an alloy powder having the nominal composition Co-20Cr-10Pt-5B-2Ta (in atomic %). The powder was ball milled for between 6 to 10 hours. The mechanically alloyed powder was subsequently subject to densification by HIP'ing at 15,000 psi at 1900° F. for 4 hours. The Hipped billet was finally machined to form a RM-Gun target with a 6" OD and a thickness of 0.250". The resultant target alloy had a density of 9.94 and a PTF between 70% to 90%.

An alloy possessing the same nominal composition as above was also manufactured into the same target geometry using conventional casting processes. In this case, the alloy was vacuum induction melted at approximately 2900° F. and cast into a mold to form an as-cast ingot. The ingot was subsequently roll processed at temperatures between 1600° F. and 2200° F. and machined to yield an RM-Gun target with equivalent density and PTF properties as the rapidly solidified target. The values of PTF for the targets manufactured using the different process routes were maintained equivalent to rule out target macromagnetic performance as a contributor to any difference obtained in deposited film properties after sputtering. An MDP-250B sputter machine was used in the media manufacturing trials. The following media architecture was employed to study the effects of the diversely processed Co-alloy targets: glass substrate—NiAl seed layer—Cr under layer—CoCr onset layer—Co20Cr10Pt5B2Ta magnetic layer—carbon over coat. The master-alloy and conventional magnetic targets were placed side-by-side in the sputter chamber so that opposite sides of the disk were sputtered using targets with the same composition, but manufactured using different paradigms. All other target pairs employed in this experiment were manufactured identically. This side-by-side analysis was conducted to integrate out any mitigating effects associated with the sputter process or architecture. After several thousand thin-film disks were manufactured, the Co-alloy magnetic targets were switched and re-run to ensure that no left/right chamber effects were biasing the results.

Figure 9:
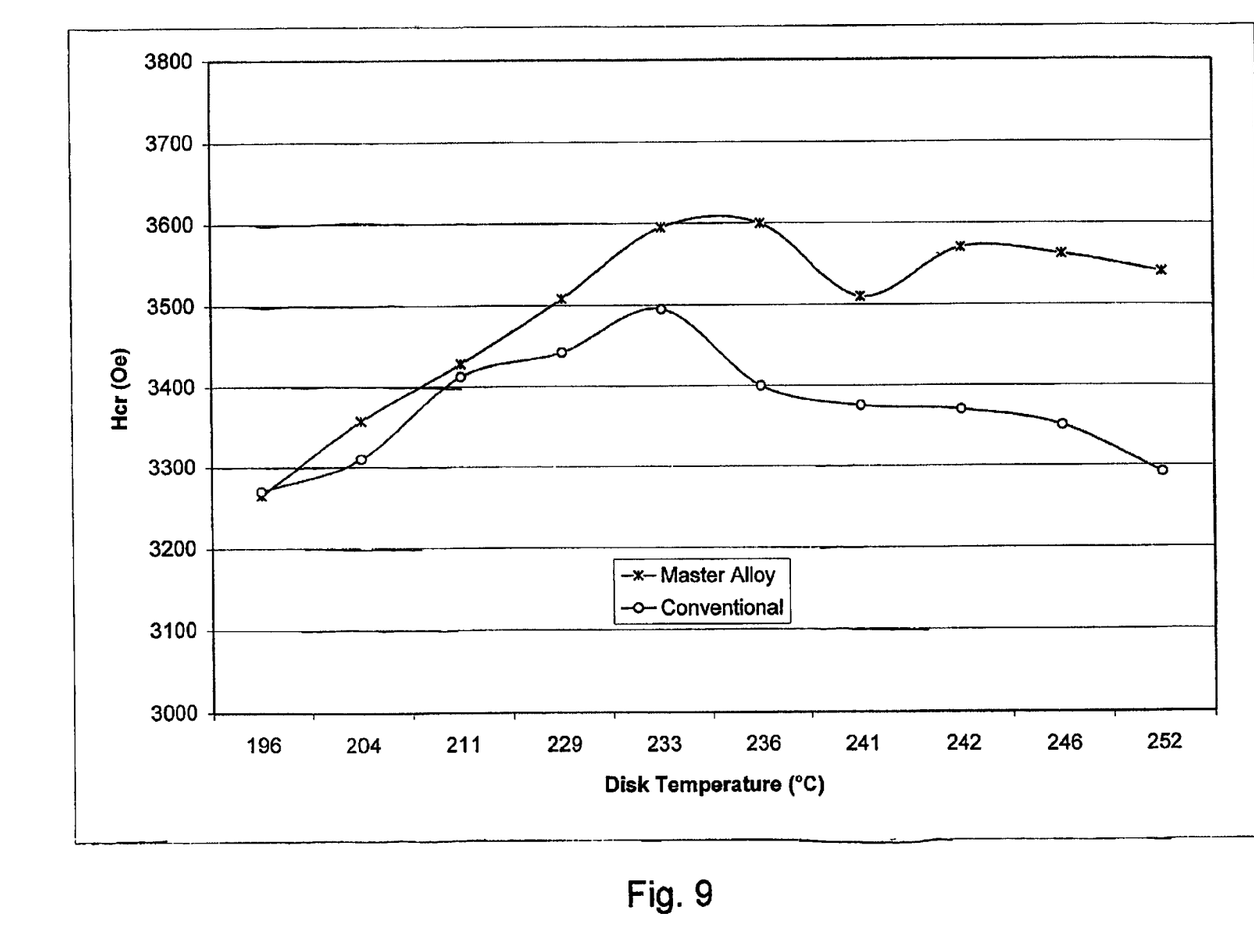
FIG. 9 depicts the dependency of magnetic coercivity (Hcr) on disk temperature for magnetic media samples manufactured using master alloyed and conventially cast CoCrPtBTa alloy targets.
Figure 10:
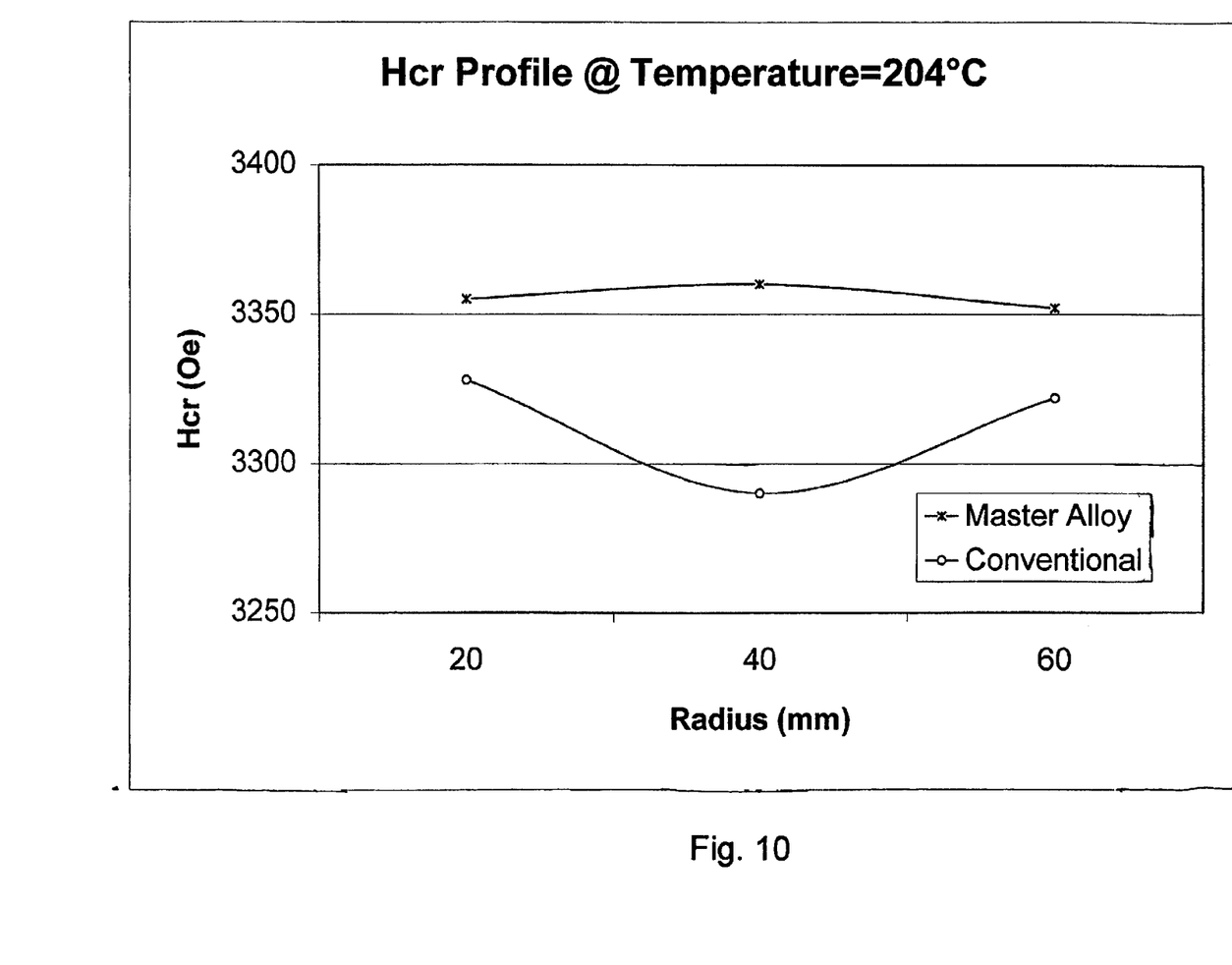
FIG. 10 demonstrates the improved disk ID to OD coercivity and coercivity uniformity for magnetic media samples manufactured using master alloyed and conventionally cast CoCrPtBTa alloy targets.

FIG. 9 depicts the average magnetic results for this test. Clearly, with all facets of the sputter process, architecture and target nominal chemistry held constant, the side of the media disk sputtered with the Co-alloy manufactured using the art described herein consistently yielded a higher nominal value of magnetic coercivity. Magnetic coactivity is an important recording parameter; higher values of magnetic coactivity typically render improvements in media aerial data storage density and thermal stability. The data in FIG. 9 was generated over a range of substrate temperatures, and demonstrates that the advantages associated with using the master-alloy target are enhanced in the higher temperature regime. This result is particularly salient since elevated deposition temperature is a frequently used sputter-processing tool to optimize media signal-to-noise ratio. Thus, the ability to maintain high magnetic coercivity at higher substrate temperatures promotes more process flexibility to optimize media signal-to-noise ratio performance. FIG. 10 compares the ID-to-OD disk coercivity uniformity (at a substrate temperature of approximately 200° C.). As previously discussed, not only does the master alloy target promote a higher nominal magnetic coercivity, but it also results in a more uniform ID-to-OD magnetic coercivity uniformity on the thin film disk. As discussed in the paper by Harkness et al., this improvement in both uniformity and nominal magnetic performance is most likely due to the more efficient and homogeneous transfer of atoms from the target material to the thin-film disk.

EXAMPLE 2

Similar to the case in Example 1, a target with nominal composition Co-19 Cr-11Pt-8B (in atomic %) was manufactured using a combination of Co-(20 to 25)Cr-(5 to 10)B, Co-(20 to 25)Cr, and Co-(5 to 10)B (in weight %) master alloy powders and pure Pt. The mechanical alloying and Hipping parameters were similar to those described in Example 1. Furthermore, a conventional cast and rolled target possessing the same nominal composition was manufactured using similar processes as those described in the previous example. The density and final product PTF of targets manufactured using the master alloy and conventional techniques were equivalent for the purpose of this experiment.

Figure 11:
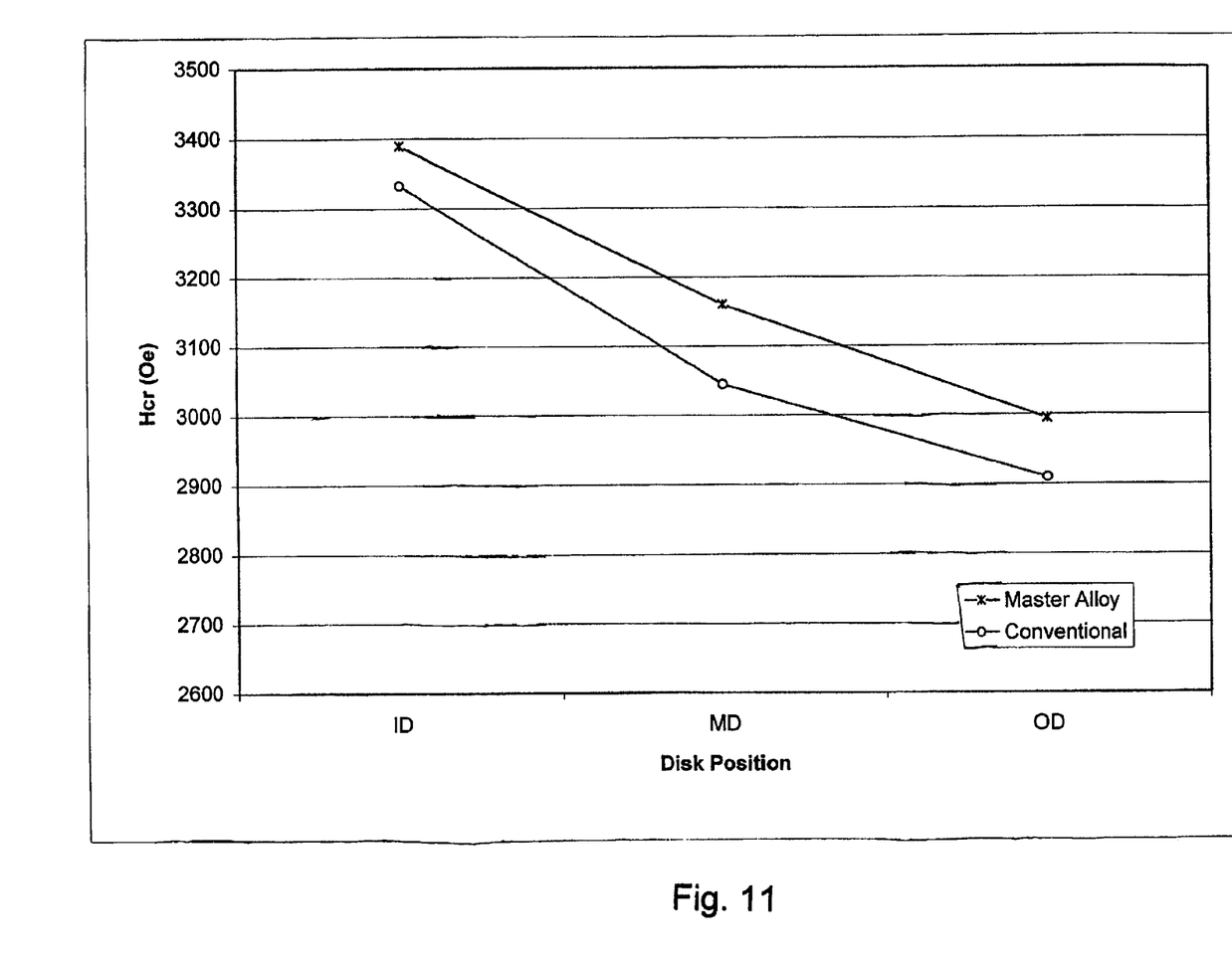
FIG. 11 demonstrates the improved disk ID to OD coercivity for magnetic media samples manufactured using master alloyed and conventionally cast CoCrPtB alloy targets.
Figure 12:
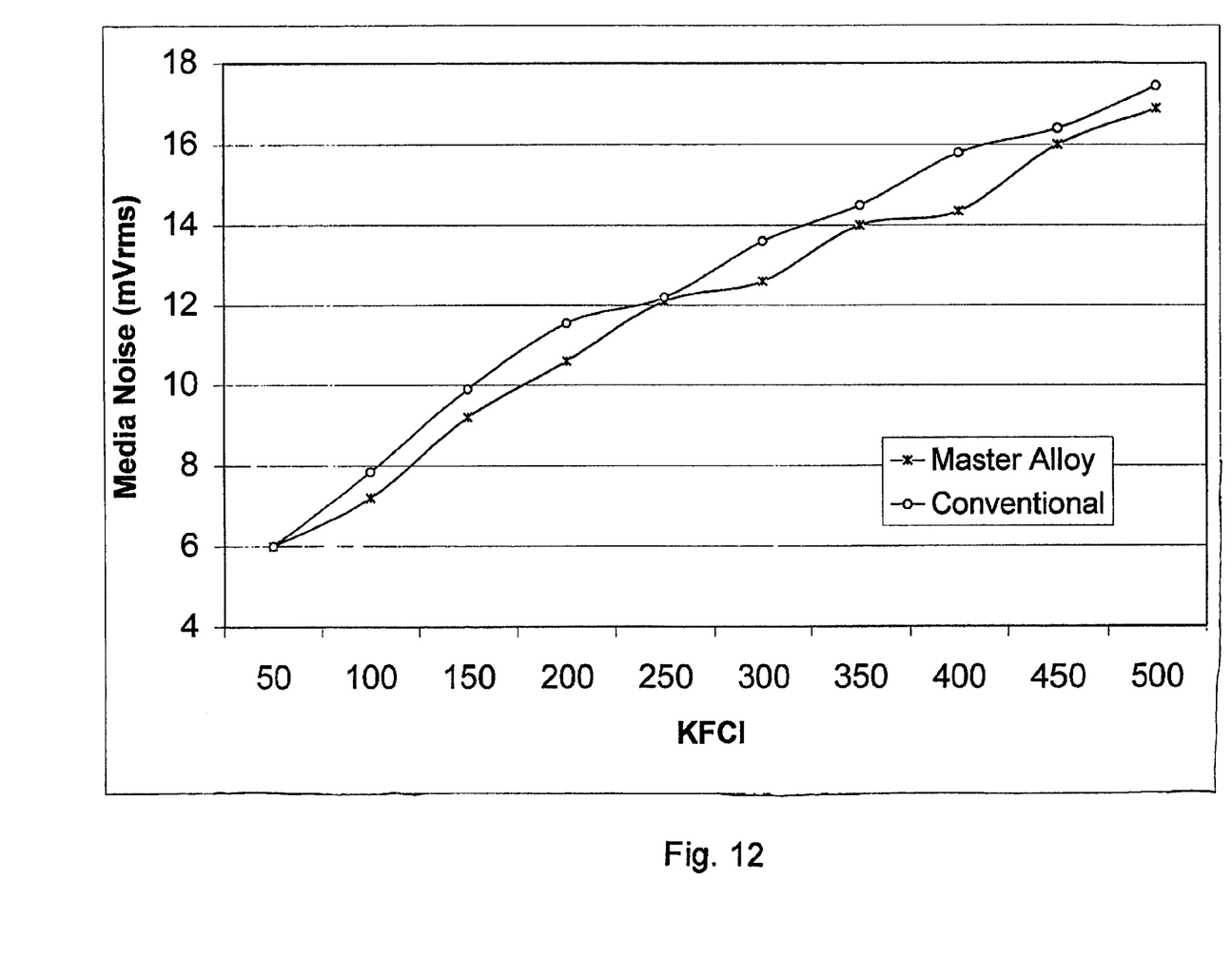
FIG. 12 depicts the improvement in media signal to noise ratio when manufactured using master alloyed CoCrPtB target product.

The same media manufacturing paradigms as described in Example 1 were employed, with the exception of architecture. In this study, the following architecture was utilized: Al substrate—CrMo under layer—CoCr inter layer—Co19Cr-11Pt-8B magnetic layer—C over coat. As in the previous example, FIG. 11 reveals that the master alloy target promoted a noticeable improvement in nominal disk magnetic coercivity with a marginal improvement in ID-to-OD uniformity. FIG. 12, reveals that the sample media noise on the side of the disk manufactured using the master alloy magnetic target is noticeably lower that on the side manufactured suing the conventional target over a very broad range of recording densities. Once again, this example demonstrates that the phase design paradigms utilized in art described herein to manufacture Co-based sputtering targets renders equivalent or better thin film media magnetic recording performance. This result is especially noteworthy when added to the fact that the master alloy approach enables manufacture of complex next-generation Co-based alloys not fabricable using conventional means.

While this invention has been described with reference to a preferred embodiment, it is contemplated that various alterations and modifications thereof will become apparent to those skilled in the art upon a reading of the preceding detailed description. It is therefore intended that the following appended claims be interpreted as including all such alterations and modifications as fall within the true spirit and scope of this invention.

What is claimed is:

1. A precious metal magnetic sputtering target comprising a mechanically alloyed, chemically homogeneous alloy composition having microstructural homogeneity, said alloy composition comprising Pt, Co, Cr, and at least 2 atomic % B.

2. The sputtering target according to claim 1, wherein said alloy contains multiple phases comprising CoB, CoCrB, CoCr, CoPt, CoCrPt, and Pt uniformly distributed in the alloy.

3. The sputtering target according to claim 1, wherein said alloy further includes tantalum and said alloy comprises Co-20Cr-10Pt-2Ta-5B.

4. The sputtering target according to claim 1, wherein the atomic % of B ranges from 2 atomic % to 30 atomic %.

5. The sputtering target according to claim 1, wherein the atomic % of B is at least 6 atomic %.

6. The sputtering target according to claim 5, wherein said alloy comprises Co-19Cr-11Pt-8B.

7. The sputtering target according to claim 5, wherein said alloy comprises Co-15Cr-11Pt-10B.

8. The sputtering target according to claim 5, wherein said alloy comprises Co-20Cr-10Pt-6B.

9. The sputtering target according to claim 5, wherein said alloy comprises Co-10Cr-10Pt-20B.

10. The sputtering target according to claim 5, wherein said alloy comprises Co-12Cr-12Pt-18B.

11. The sputtering target according to claim 5, wherein said alloy comprises Co-12Cr-8Pt-22B.

* * * * *